United States Patent [19]
Nakajima et al.

[11] Patent Number: 5,459,851
[45] Date of Patent: Oct. 17, 1995

[54] DUAL-PORT MEMORY WITH SELECTIVE READ DATA OUTPUT PROHIBITION

[75] Inventors: Toyokatsu Nakajima; Mitsuru Sugita, both of Hyogo, Japan

[73] Assignee: Mitsubishi Denki Kabushiki Kaisha, Tokyo, Japan

[21] Appl. No.: 298,083

[22] Filed: Aug. 31, 1994

Related U.S. Application Data

[63] Continuation of Ser. No. 831,020, Feb. 4, 1992, abandoned.

[30] Foreign Application Priority Data

Feb. 12, 1991 [JP] Japan ................................. 3-018690

[51] Int. Cl.⁶ ...................... G06F 12/14; G06F 13/376; G11C 11/407; G11C 11/413
[52] U.S. Cl. .................. 395/476; 365/189.07; 365/195; 365/230.05; 380/4; 364/244.8; 364/259.2; 364/965.9; 364/969.4; 364/DIG. 1; 395/479
[58] Field of Search .................................. 395/425, 725; 365/189.07, 195, 230.05, 189.04; 380/3, 4

[56] References Cited

U.S. PATENT DOCUMENTS

| | | | |
|---|---|---|---|
| 3,742,458 | 6/1973 | Inoue et al. | 395/425 |
| 4,577,292 | 3/1986 | Bernstein | 365/230.05 |
| 4,590,552 | 5/1986 | Guttag et al. | 395/425 |
| 4,742,487 | 5/1988 | Bernstein | 365/195 |
| 4,823,321 | 4/1989 | Aoyama | 365/230.05 |
| 4,975,870 | 12/1990 | Knicely et al. | 395/425 |
| 4,975,878 | 12/1990 | Boddu et al. | 365/189.07 |
| 5,014,247 | 5/1991 | Albachten, III et al. | 365/230.05 |
| 5,036,491 | 7/1991 | Yamaguchi et al. | 365/189.07 |
| 5,097,445 | 3/1992 | Yamauchi | 395/425 |

OTHER PUBLICATIONS

"Dual–Port–RAM–Speicher mit quasigleichzeitigem Zugriff", by Ing. (grad) H. R. Schindlbeck, Elektronik Informationen, Nr. 12–1983, pp. 52–53.

*Primary Examiner*—Glenn Gossage
*Attorney, Agent, or Firm*—Lowe, Price, LeBlanc & Becker

[57] ABSTRACT

A dual-port memory is interposed between a host system and a slave system in a multiprocessor system, and data transmission between the host system and the slave system is performed through the dual-port memory using first and second input/output ports, the dual-port memory being accessible from the host system and the slave system simultaneously. An address region of the dual-port memory is placed overlapping the address space of an internal memory of the host system, so that no change is needed in programming in the host system, however, data collision may be generated in a region in the address space shared by the internal memory and the dual-port memory. In order to prevent data collision, the dual-port memory includes a memory cell array having a plurality of memory cells, first cell selection circuitry and second cell selection circuitry, and read data output prohibiting circuitry which prohibits data read out from a selected memory cell from being output to the host system. The output of data read out from a portion of the memory cells in the memory array may be prohibited instead.

10 Claims, 7 Drawing Sheets

DUAL-PORT MEMORY WITH SELECTIVE READ DATA OUTPUT PROHIBITION

This application is a continuation of application Ser. No. 07/831,020 filed Feb. 4, 1992, now abandoned.

BACKGROUND OF THE INVENTION

1. Field of the Invention

The present invention relates generally to a dual-port memory, and more specifically, to a dual-port memory used in data transmission between multiprocessor systems.

2. Description of the Background Art

FIG. 3 is a block diagram showing one working embodiment of a dual-port memory. In FIG. 3, a dual-port memory 1 includes two input/output ports. One input/output port (hereinafter referred to as A port) is connected to a host system 3 through a system bus 2. The other port (hereinafter referred to as B port) of dual-port memory 1 is connected to a slave system 5 through a system bus 4. Host system 3 and slave system 5 may be of any type for processing data. For example, a multiprocessor system including a central processing unit (CPU) is often used. Therefore, host system 3 includes a host CPU 31, a read only memory (ROM) 32 and a random access memory (RAM) 33, and slave system 5 includes a slave CPU 51, a ROM 52 and a RAM 53. Dual-port memory 1 includes memory means therein. The memory means is accessible individually by host system 3 and slave system 5.

Dual-port memory 1 as described above is often used for exchanging data between host system 3 and slave system 5. For example, if host system 3 and slave system 5 operate asynchronously to each other, it is difficult to make direct data transmission between the systems. Performing the data transmission through dual-port memory 1 allows data to be transferred between the systems when necessary. Thus, the throughputs of the systems are improved, and systems 3 and 5 operate in a cooperative manner each other, so that a larger system can be structured.

FIG. 4 is a block diagram showing one embodiment of a structure of a conventional dual-port memory. In FIG. 4, placed in a memory cell array 10, as shown in FIG. 5, are a plurality of word lines and bit lines crossing each other, and a memory cell is placed at a crossing point of each word line and each bit line. A decoder 11a and a sense amplifier 12a for A port, and a decoder 11b and a sense amplifier 12b for B port are provided for memory cell array 10. A port address data from host system 3 is applied to decoder 11a through an address input terminal 13a, and B port address data from slave system 5 is applied to decoder 11b through an address input terminal 13b. Provided in parallel between sense amplifier 12a and an A port data input/output terminal 14a are a tri-state buffer 15a for writing data, and a tri-state buffer 16a for reading data. A write enable signal is applied from host system 3 to a control terminal of tri-state buffer 15a through an A port write signal input terminal 17a. The output state of tri-state buffer 15a is controlled based on the write enable signal. A read enable signal is applied from host system 3 to a control terminal of tri-state buffer 16a through an A port read signal input terminal 18a. Tri-state buffer 16a has its output state controlled based on the read enable signal. Similarly, for the B port, a tri-state buffer 15b for writing data, and a tri-state buffer 16b for reading data are provided in parallel between a sense amplifier 12b and a B port data input/output terminal 14b. A write enable signal is applied from slave system 5 to control terminal of tri-state buffer 15b through a B port write signal input terminal 17b. Tri-state buffer 15b has its output state controlled based on the write enable signal. A read enable signal is applied from slave system 5 to a control terminal of tri-state buffer 16b through a B port read signal input terminal 18b. Tri-state buffer 16b has its output state controlled based on the read enable signal.

FIG. 5 is a diagram showing an input/output structure for one memory cell in memory cell array 10 shown in FIG. 4. A plurality of memory cells 101 are disposed in a matrix of rows and columns. In memory cell array 10, as shown in FIG. 5, two word lines 103a and 103b are disposed for each row for memory cell 101, and two bit lines 104a and 104b are disposed for each column. One memory cell 101 is provided with two transfer gate transistors 102a and 102b. Word line 103a, bit line 104a, and transfer gate transistor 102a are provided for the A port. Word line 103b, bit line 104b, and transfer gate transistor 102b are provided for the B port. In the dual-port memory shown in FIGS. 4 and 5, the A port and B ports are thus each provided with an entirely separate and independent access system. Memory cell array 10 is therefore simultaneously accessible from host system 3 and slave system 5.

In a thus structured dual-port memory 1, tri-state buffer 15a is activated in response to a write request from host system 3, and write data from host system 3 is applied to sense amplifier 12a. Tri-state buffer 15b is activated in response to a write request from slave system 5, and write data is applied to sense amplifier 12b. Furthermore, tri-state buffer 16a is activated in response to a read request from host system 3, and data read out from an activated and selected memory cell is output to the host system through A port data input/output terminal 14a. Tri-state buffer 16b is activated in response to a read request from slave system 5, and data read out from an activated and selected memory cell is output to slave system 5 through B port data input/output terminal 14b.

It could be considered that a whole multiprocessor system is structured in a following manner. First, there exists a single and complete processor, and then a slave system utilizing a part of data from a host system is added to the single and complete processor which is used as the host system, whereby a whole multiprocessor system can be realized. In this case, as shown in FIG. 6, if a dual-port memory address region could be superimposed on the address space 34 of the memories in the host system controlled by host CPU 31, a slave system could be added without providing any program change in the host system, because the address space of the memories controlled in the host system would not be expanded.

Conventionally, however, it has been impossible to provide the address region of the dual-port memory in the address space of the memories inside the host system. When host CPU 31 tries to read out data from the dual-port memory, data collisions take place, because internal memory regions having the same addresses are also designated.

Therefore, if a slave system is added to an already completed host system, as shown in FIG. 7, it is necessary to keep the address region of the dual-port memory from overlapping the address space of the internal memory of the host system, and, therefore, cumbersome reprogramming is required of the host system.

Now, the above-described problem will be described more in detail by referring to the engine control of an automobile.

In case of the engine control of an automatic shift car, data for an engine control system is necessary for controlling its transmission devices. However, as is the case with a manual shift car such as a sports car, the control of transmission devices is not performed by a microcomputer in some cases. In other words, among automobiles installed with the same engines, some require transmission control by a microcomputer, and others do not. When a microcomputer system for engine control is designed taking into account whether a microcomputer for transmission control is necessary or not, different programmings are necessary depending upon the existence or absence of data transmission processings between the host system and dual-port memory, which is troublesome and often responsible for problems.

SUMMARY OF THE INVENTION

It is therefore an object of the present invention to provide a dual-port memory which can be structured as a part of a multi-processor system without changing programs in the host system.

A dual-port memory in accordance with the present invention performs data transmission with first and second systems through first and second input/output ports, and is accessible from these first and second systems simultaneously. The dual-port memory includes a memory cell array having a plurality of memory cells, first and second memory cell selection means, and read data output prohibiting means. The first memory selection means selects one of the memory cells in the memory cell array based on address data from a first system. The second memory cell selection means selects one of the memory cells in the memory cell array based on address data from the second system. The read data output prohibiting means prohibits data read out from the selected memory cell from being output.

In a dual-port memory in accordance with the present invention, the output of data read out from the selected memory cell is prohibited by the read data output prohibiting means. No data collision therefore takes place if the address region of the dual-port memory overlaps the address space of internal memories in the host system.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
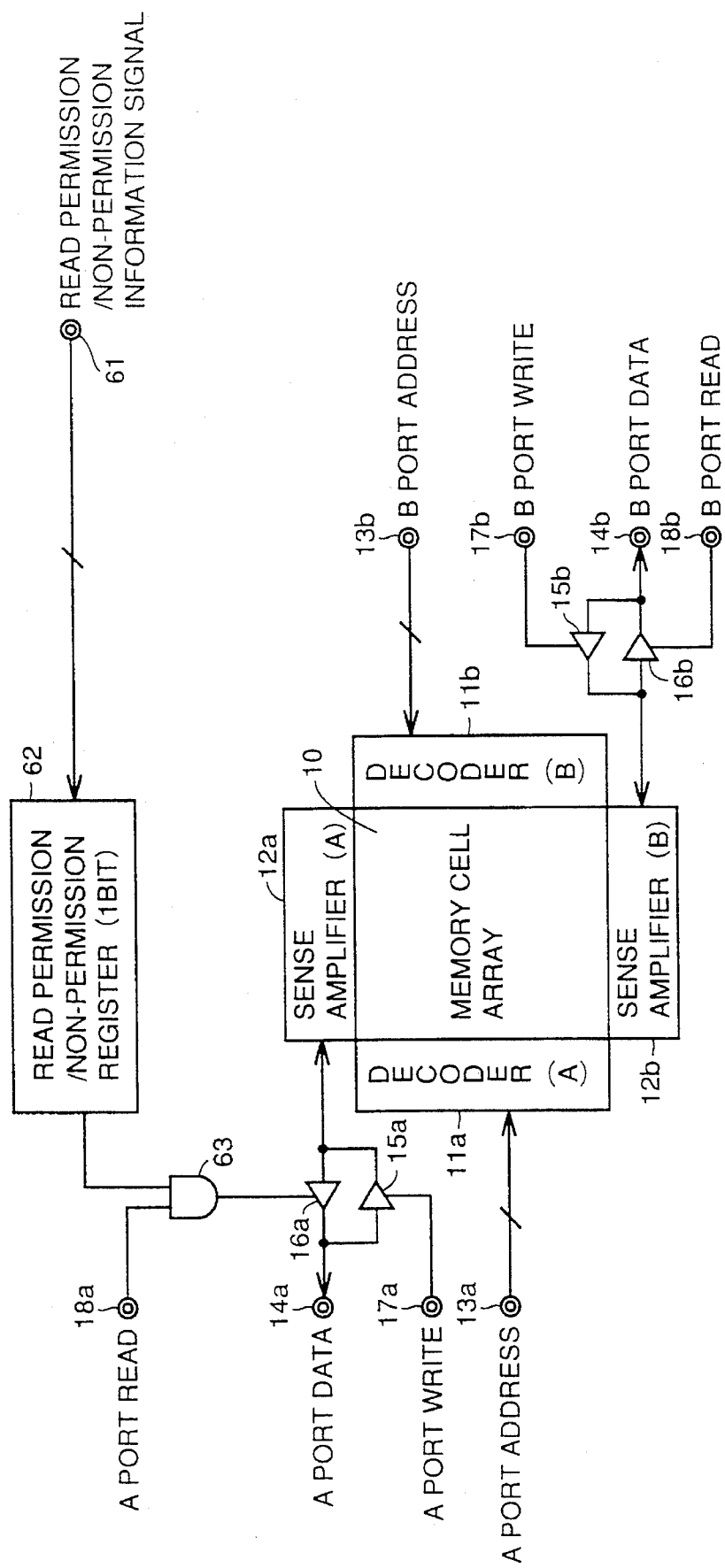
FIG. 1 is a block diagram showing a structure of one embodiment in accordance with the present invention.

FIG. 1 is a block diagram showing a structure of a dual-port memory in accordance with one embodiment of the present invention. The dual-port memory shown in FIG. 1 is substantially identical to the structure of the conventional dual-port memory shown in FIG. 4, with essentially only the following differences. The same reference characters denote the same or corresponding portions, and description thereof will not be provided.

Figure 3:
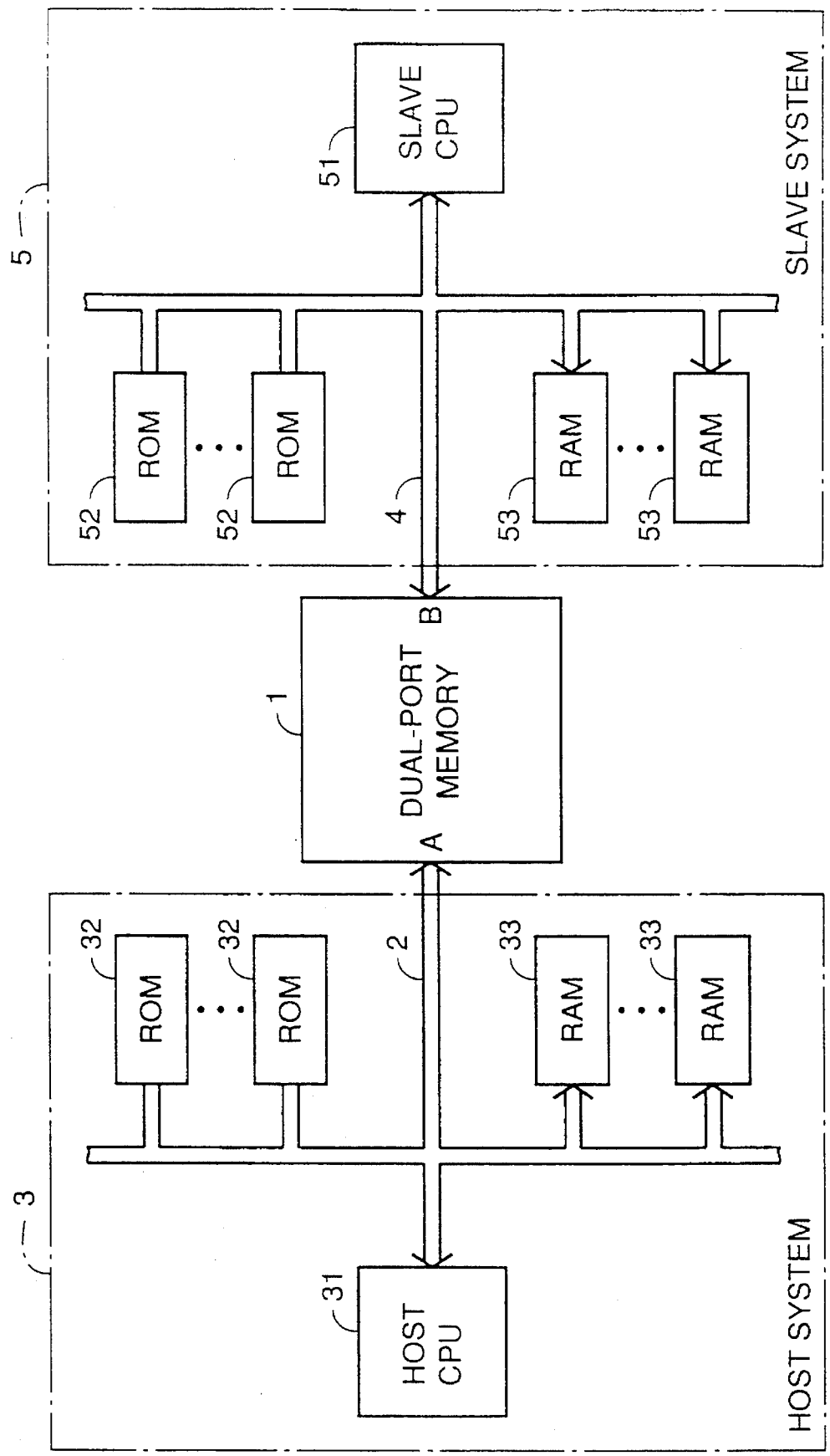
FIG. 3 is a block diagram showing one embodiment of a prior art multiprocessor system including a dual-port memory.

In FIG. 1, a read permission/non-permission information signal is applied to a read permission/non-permission information input terminal 61. The read permission/non-permission information signal may be generated in host system 3, slave system 5 shown in FIG. 3, or in other externally provided circuits. The 1 bit read permission/non-permission information signal input to the read permission/non-permission information input terminal 61 is stored in a read permission/non-permission register 62. Read permission/non-permission register 62 is formed of, for example, a flipflop capable of storing data of at least 1 bit. The output of read permission/non-permission register 62 is applied to one input terminal of an AND gate 63. A read enable signal is applied from host system 3 to the other input terminal of AND gate 63 through A port read signal input terminal 18a. The output of AND gate 63 is applied to a control terminal of tri-state buffer 16a for reading from the A port.

Now, the operation of the embodiment shown in FIG. 1 will be described.

Description will be given of the case in which high (H) level read permission/non-permission information is set in read permission/non-permission register 62. In this case, an H level signal is applied to one input terminal of AND gate 63 from read permission/non-permission register 62. In this state, a read enable signal of an H level is input from host system 3 through A port read signal input terminal 18a when a read request is output from host system 3. The H level read enable signal is applied to the other input terminal of AND gate 63. The output of AND gate 63 therefore attains the H level. Consequently, tri-state buffer 16a is activated, and data read out from the memory cell is output to host system 3 from A port data input/output terminal 14a passing through tri-state buffer 16a.

Description will be given on the case in which L level read permission/non-permission information is set in read permission/non-permission register 62. The potential of one input terminal of AND gate 63 is constantly at an L level, and, therefore, the output of AND gate 63 maintains the L level even if a read request is output from host system 3. Tri-state buffer 16a is therefore in a state of high impedance, and data read out from a memory cell can not pass through tri-state buffer 16a. Consequently, data collision is prevented. In other words, when an address in the internal memory of the host system and a corresponding address of memory cell array 10 are designated at the same time, read data from memory cell array 10 is not output to host system 3, thereby preventing data collision.

Figure 4:
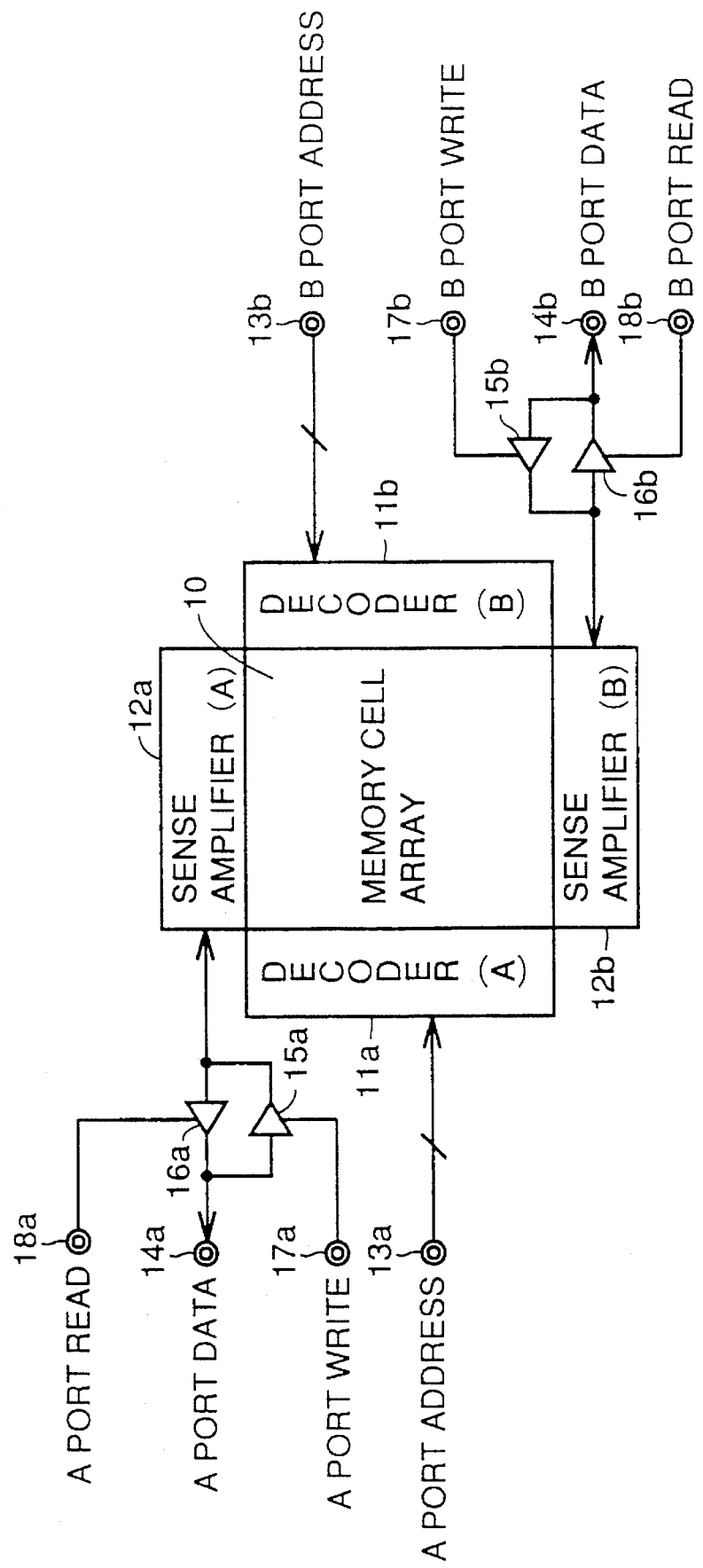
FIG. 4 is a block diagram showing one embodiment of a structure of a conventional dual-port memory.
Figure 5:
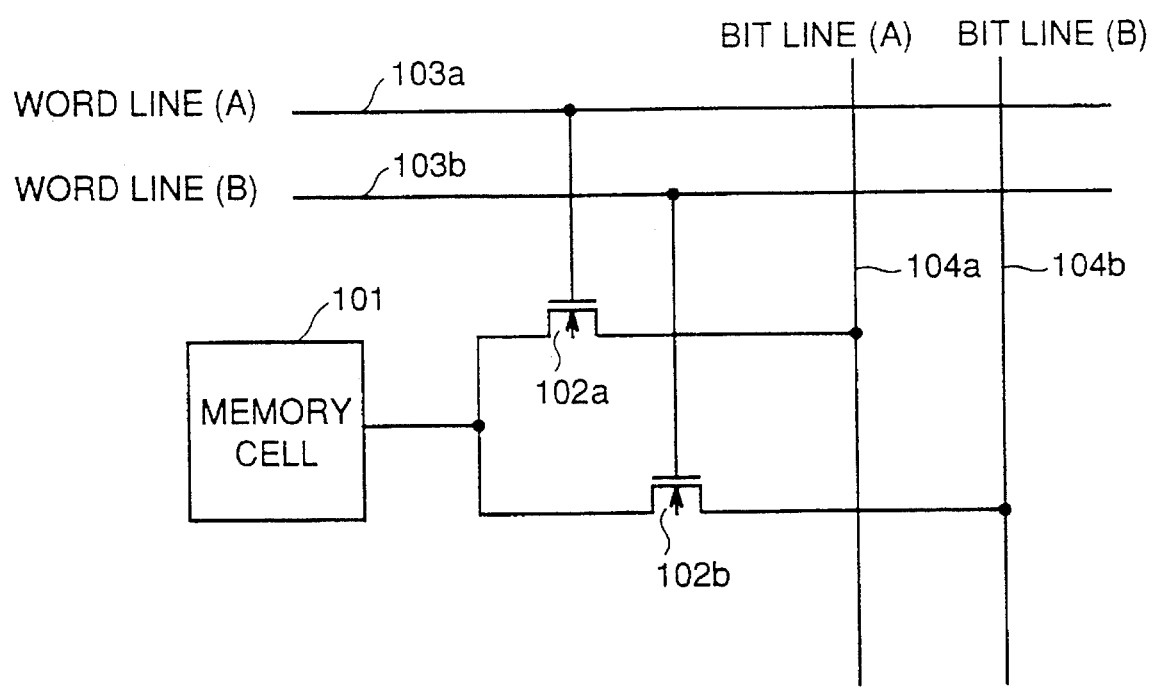
FIG. 5 is a circuit diagram partially showing the internal structure of a memory cell array in the dual-port memory shown in FIG. 4.
Figure 6:
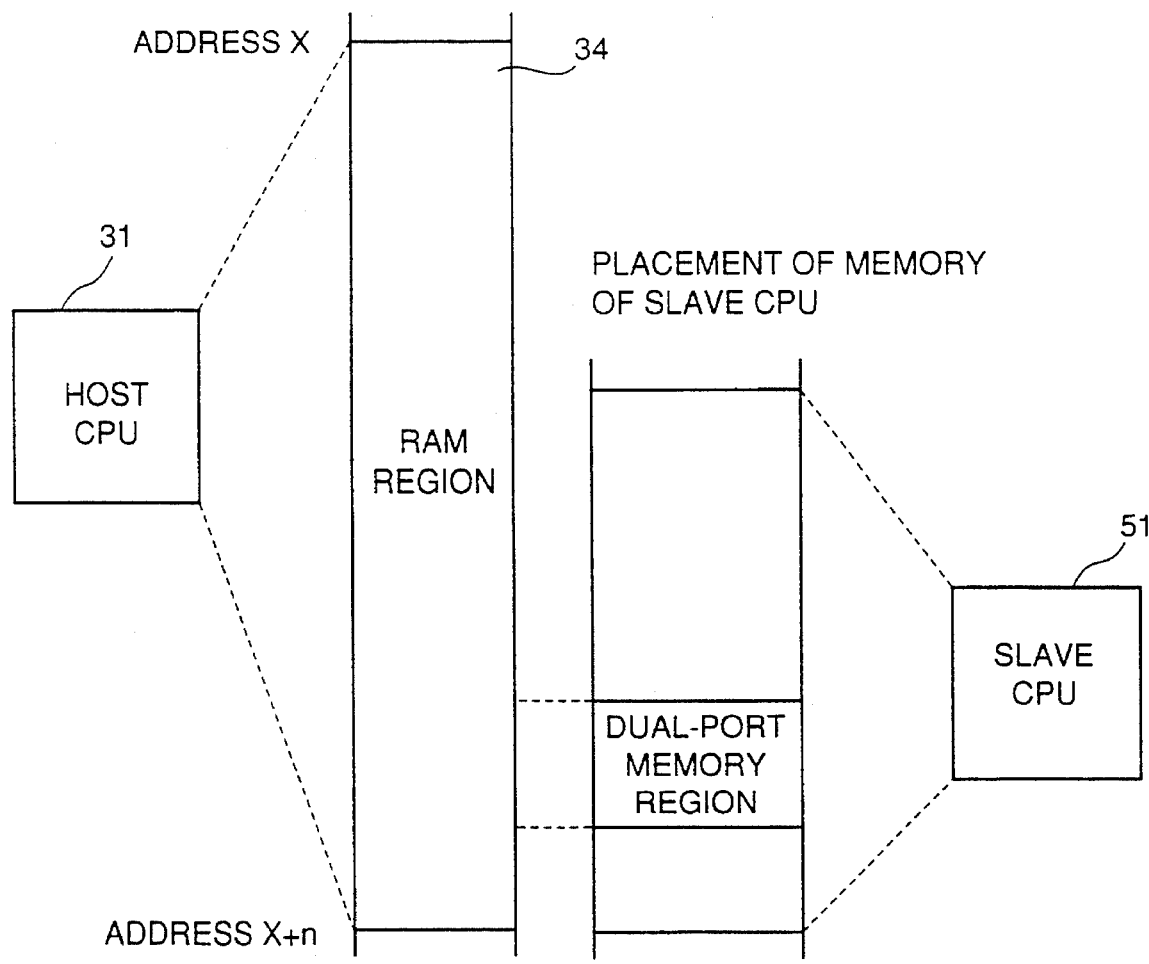
FIG. 6 is a diagram showing one example of a relation between the memory region of a host CPU and a dual-port memory region.
Figure 7:
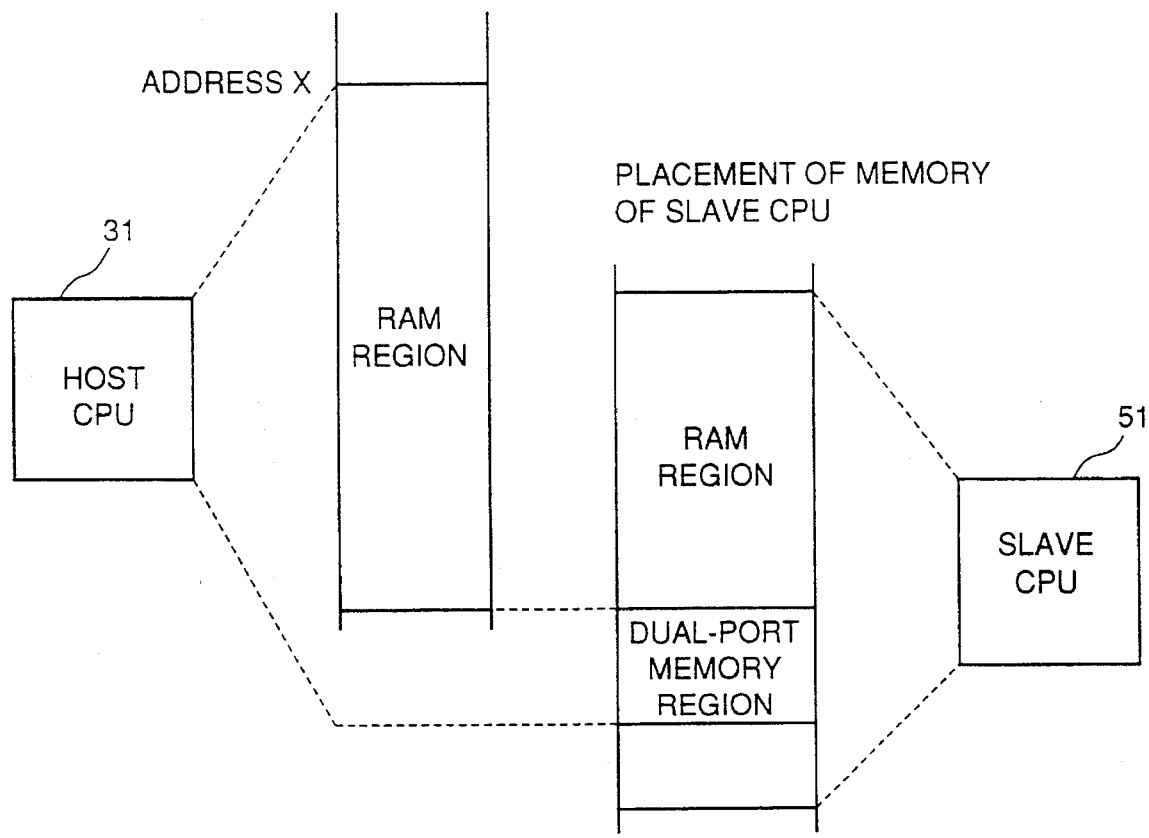
FIG. 7 is a diagram showing another example of the relation between the memory region of a host CPU and a dual-port memory region.

The other operations of the embodiment shown in FIG. 1 are essentially the same as those of the embodiment shown in FIG. 4. In other words, host system 3 is capable of writing data into memory cell array 10, and slave system 5 is capable of writing and reading data into and from memory cell array 10.

Although the output of data read out from all the memory cells in memory cell array 10 is prohibited if a read request is output from host system 3 in the state in which L level read permission/non-permission information is set in read permission/non-permission register 62, the output of data read out from a part of memory cells in the memory cell array may be prohibited instead. Such an embodiment will be described in the following.

Figure 2:
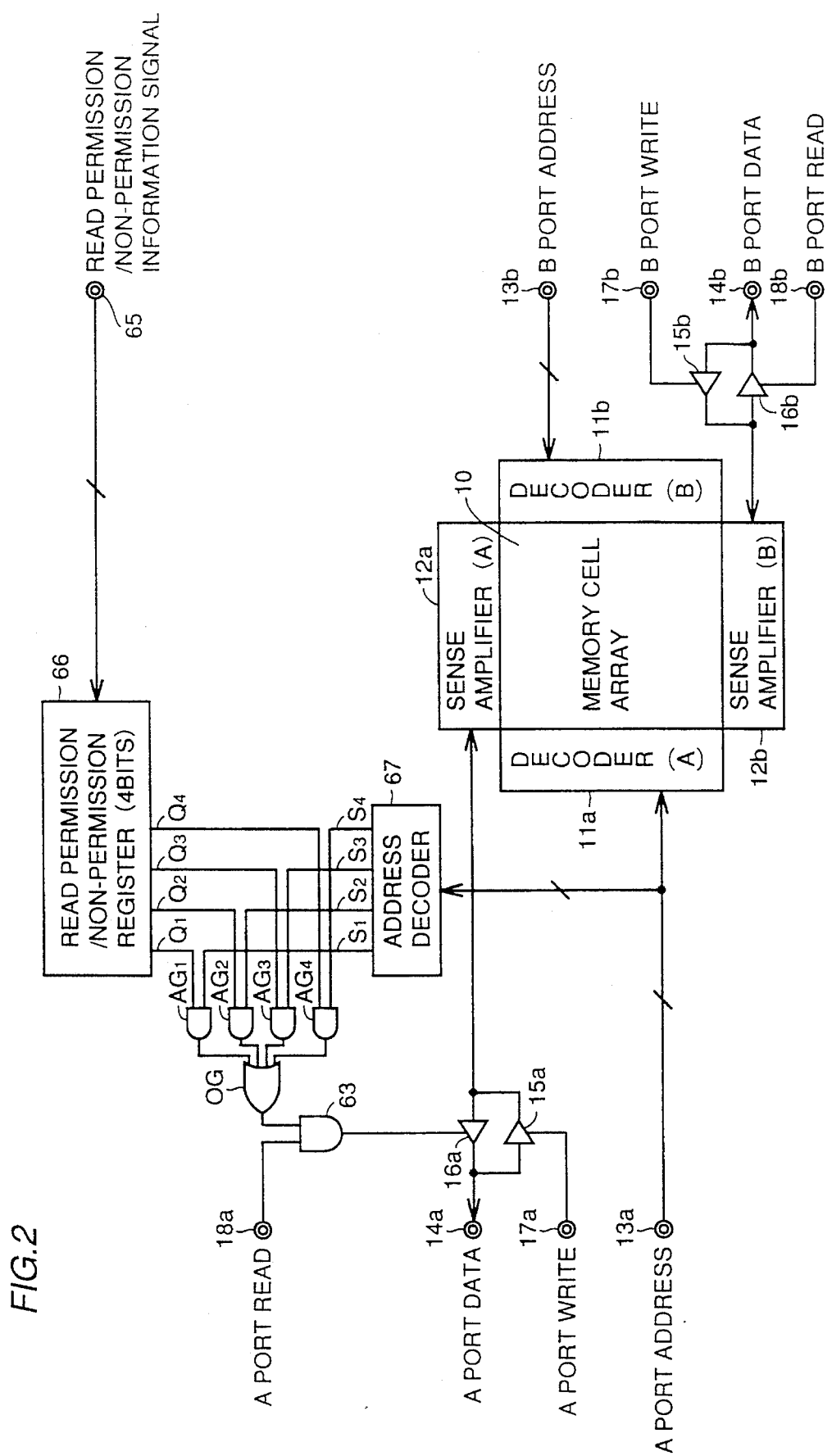
FIG. 2 is a block diagram showing a structure of another embodiment in accordance with the present invention.

FIG. 2 is a block diagram showing a structure of another embodiment of the present invention. The embodiment shown in FIG. 2 has a substantially identical structure to that of the embodiment shown in FIG. 1 with the following essential differences. The same reference numerals denote the same or corresponding portions, and the description thereof will not be provided.

In FIG. 2, a read permission/non-permission information signal of, for example, 4 bits is input from a read permission/non-permission information signal input terminal 65. Memory cell array 10 is divided into four sub areas, and the 4 bit read permission/non-permission information corresponds to each of the sub areas. The 4 bit read permission/non-permission information signal input from read permission/non-permission information input terminal 65 is stored in a read permission/non-permission register 66. Read permission/non-permission register 66 is structured by, for example, four flipflops, so that 4 bit read permission/non-permission information can be stored therein. Outputs Q1 to Q4 output from flipflops in read permission/non-permission register 66 are applied to one input terminal of each of AND gates AG1 to AG4, respectively. An address decoder 67 decodes address data applied from host system 3 through address input terminal 13a, and outputs decoded signals S1 to S4. These decoded signals S1 to S4 are applied to the other input terminals of AND gates AG1 to AG4, respectively. The decoded signals S1 to S4 from address decoder 67 each correspond to a sub area in memory cell array 10. In other words, if an access is made to the first sub area in memory cell array 10, the decoded signal S1 attains an H level, and the other decoded signals S2 through S4 attain an L level. Also, when an access is made to the second sub area in memory cell array 10, only the decoded signal S2 attains an H level, and the other decoded signals S1, S3 and S4 attain the L level. Similarly, when an access is made to the third or fourth sub area, only the decoded signal S3 or S4, respectively, attains the H level.

The outputs of AND gates AG1 to AG4 are applied to an OR gate OG. The output of OR gate OG is applied to one input terminal of AND gate 63. A read enable signal is applied from host system 3 to the other input terminal of AND gate 63 through A port read signal input terminal 18a. The output of AND gate 63 is applied to a control terminal of tri-state buffer 16a for reading from the A port.

Now, the operation of the embodiment shown in FIG. 2 will be described. The device of the embodiment shown in FIG. 2 is capable of prohibiting the output of the data read out from a part of the plurality of memory cells in memory cell array 10. In other words, the output prohibition of the read out data can be controlled for each cell block. Now, description will be provided on a case in which the output of data read out from the first sub block and second sub block in memory cell array 10 is prohibited. In this case, among the contents of read permission/non-permission information of 4 bits in read permission/non-permission register 66, the first bit is in an L level, the second bit is in the L level, the third bit in an H level, and the fourth bit in the H level. The levels of the output signals Q1 and Q2 from read permission/non-permission register 66 become the L level, and the signals Q3 and Q4 attain the H level. When a request for reading from the first sub block in memory cell array 10 is generated in host system 3 in this state, address decoder 67 brings only the decoded signal S1 to the H level, and the other decoded signals S2 to S4 are pulled to the L level. The H level decoded signal S1 is applied to the AND gate AG1 and the output of AND gate AG1 attains the L level, because the output signal Q1 of read permission/non-permission register 66 is at the L level as described above. As for the other AND gates AG2 to AG4, the outputs attain the L level, because the decoded signals S2 to S4 are at the L level. Consequently, all the L level signals are input to OR gate OG, the output thereof thus being at the L level. The output of AND gate 63 attains the L level. This permits tri-state buffer 16a to be in a state of high impedance, thus prohibiting data read out from the first sub block in memory cell array 10 from being output.

Assuming that a request for reading from the second sub block in memory cell array 10 is generated in host system 3, address decoder 67 pulls only the decoded signal S2 to the H level, and keeps the other decoded signals S1, S3, and S4 at the L level. The output of AND gate AG2 is at the L level, because the L level signal Q2 is applied thereto. The outputs of the other AND gates AG1, AG3, and AG4 are at the L level, because the L level decoded signals S1, S3 and S4 are applied thereto. Consequently, also in this case, as similar to the case of the read request from the first sub block, an L level signal is applied to the control terminal of tri-state buffer 16a through AND gate 63, and tri-state buffer 16a attains a high impedance state. As a result, the output of data read out from the second sub block in memory array 10 is prohibited.

If a request for reading from the third sub block in memory cell array 10 is generated in host system 3, address decoder 67 brings the decoded signal S3 to the H level, and the other decoded signals S1, S2, and S4 into the L level. The H level decoded signal S3 and H level signal Q3 are applied to AND gate AG3, and therefore its output attains the H level. The H level output of AND gate AG3 is applied to one input terminal of AND gate 63 through OR gate OG. An H level read enable signal is applied from host system 3 to the other input terminal of AND gate 63 through A port read signal input terminal 18a, and, therefore, the output of AND gate 63 attains the H level. An H level signal is applied to the control terminal of tri-state buffer 16a, activating tri-state buffer 16a accordingly. As a result, data read out from the third sub block in the memory cell array is output to host system 3 from A port data input/output terminal 14a passing through tri-state buffer 16a.

When a request for reading from the fourth sub area in memory cell array 10 is generated in host system 3, address decoder 67 turns only the decoded signal S4 into an H level signal, and the other decoded signals S1 to S3 into L level signals. AND gate AG4 is therefore supplied with the H level decoded signal S4 and the H level signal Q4, and the output of the gate attains the H level. The H level output signal from AND gate AG4 is applied to one input terminal of AND gate 63 through OR gate OG. A read enable signal is applied to the other input terminal of AND gate 63 from host system 3 through A port read signal input terminal 18a. This permits the output of AND gate 63 to attain the H level, and the H level signal is applied to the control terminal of tri-state buffer 16a. Data read out from the fourth sub area in memory cell array 10 is output to host system 3 from A port data input/output terminal 14a through tri-state buffer 16a.

As described above, the embodiment shown in FIG. 2 is capable of prohibiting only the output of data read out from the first and second sub areas in memory cell array 10. Needless to say, the combination of sub areas to be prohibited from being read out can be arbitrarily changed by changing the contents of read permission/non-permission information set in read permission/non-permission register 66. Consequently, the output of data read out from a sub area overlapping the address space of the internal memory of the host system may be prohibited.

Although in the above-described embodiments, the output of read data to one of two systems sharing a dual-port memory is prohibited, the output of data read out to the other system may be prohibited, and the output of read out data to both systems may further be prohibited.

As described above, according to the present invention, the address region of the dual-port memory can be placed overlapping the address space of the internal memory of the system which uses the dual-port memory without generating data collision. Consequently, if a slave system is added to an already completed host system, no change is needed in programming in the host system, thus tremendously simplifying designing labor and reducing mistakes associated with designing management.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dual-port memory permitting data transmission with a first system having an internal memory and a second system having an internal memory through first and second input/output ports, and accessible simultaneously by said first and second systems, said dual-port memory comprising:

a memory cell array having a plurality of memory cells;

first and second input/output ports;

first memory cell selection means for selecting one memory cell in said memory cell array based on address data from said first system;

second memory cell selection means for selecting one memory cell in said memory cell array based on address data from said second system, said first and second memory cell selection means being mutually exclusive; and read data output prohibition means for prohibiting output of data read out from the selected memory cells when an address of data read out from the internal memory of the first or second systems and a corresponding address of data read out in the dual port memory are simultaneously designated.

2. The dual-port memory in accordance with claim 1, wherein said read data output prohibition means prohibits the output of read data to one of said first and second systems.

3. The dual-port memory in accordance with claim 1, wherein said read data output prohibition means prohibits the output of the read data to both of said first and second systems.

4. The dual-port memory in accordance with claim 1, wherein said read data output prohibition means prohibits the output of data read out from all of the memory cells in said memory cell array.

5. The dual-port memory in accordance with claim 4, wherein said read data output prohibition means comprises:

gate means for gating data read out from said memory cell array; and opening/closing control means for controlling the opening/closing of said gate means.

6. The dual-port memory in accordance with claim 5, wherein said opening/closing control means controls the opening and closing of said gate means based on externally set read permission/non-permission information.

7. The dual-port memory in accordance with claim 1, wherein said data read data output prohibition means prohibits the output of data read out from a part of the memory cells in said memory cell array.

8. The dual-port memory in accordance with claim 7, wherein said data read output prohibition means comprises:

gate means for gating data read out from said memory cell array; and opening/closing control means for controlling the opening and closing of said gate means.

9. The dual-port memory in accordance with claim 8, wherein said opening/closing control means controls said gate means so as to prohibit the output of data only if data is read out from memory cells in a prescribed area of said memory cell array.

10. The dual-port memory in accordance with claim 9, wherein said opening/closing control means comprises: register means for storing read permission/non-permission information for each area in said memory cell array;

decode means for decoding address data from said first and second systems, and outputting a signal indicative of an access state for each prescribed area in said memory cell array; and opening/closing control signal generation means for generating an opening/closing control signal for said gate means based on the read permission/non-permission information stored in said register means and an output signal from said decode means.

* * * * *